United States Patent
Bandic et al.

(10) Patent No.: US 10,360,973 B2
(45) Date of Patent: Jul. 23, 2019

(54) DATA MAPPING ENABLING FAST READ MULTI-LEVEL 3D NAND TO IMPROVE LIFETIME CAPACITY

(71) Applicant: Western Digital Technologies, Inc., San Jose, CA (US)

(72) Inventors: Zvonimir Z. Bandic, San Jose, CA (US); Robert Eugeniu Mateescu, San Jose, CA (US); Minghai Qin, San Jose, CA (US); Chao Sun, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/472,326

(22) Filed: Mar. 29, 2017

(65) Prior Publication Data

US 2018/0182453 A1     Jun. 28, 2018

Related U.S. Application Data

(60) Provisional application No. 62/438,821, filed on Dec. 23, 2016.

(51) Int. Cl.
   *G06F 12/02*        (2006.01)
   *G11C 11/56*       (2006.01)
   (Continued)

(52) U.S. Cl.
   CPC ...... *G11C 11/5628* (2013.01); *G11C 16/0483* (2013.01); *G11C 16/08* (2013.01); *G11C 2211/5641* (2013.01)

(58) Field of Classification Search
   CPC .................................................. G11C 11/5628
   (Continued)

(56) References Cited

U.S. PATENT DOCUMENTS 5,815,434 A   *   9/1998   Hasbun ............... G11C 11/5621
                                                      365/185.03
7,388,781 B2     6/2008   Litsyn et al.
(Continued)

FOREIGN PATENT DOCUMENTS

KR      20160023633 A     3/2016
WO      2016116930 A1     7/2016

OTHER PUBLICATIONS

Jagmohan, et al.; Adaptive Endurance Coding for NAND Flash; date unknown; 5 total pages.
(Continued)

*Primary Examiner* — Min Huang
(74) *Attorney, Agent, or Firm* — Patterson & Sheridan, LLP; Steven Versteeg

(57) ABSTRACT

In this disclosure, data mapping based on three dimensional lattices that have an improved sum rate (i.e., lifetime capacity) with low read latency is disclosed. During the write, a memory location is written to multiple times prior to erasure. Specifically, for the first write, there are 4/3 bits per cell available for writing, which is about 10.67 kB per cell are used for data storage. Then, for the second write, there is one bit per cell, which is 8 kB per cell for data storage. If considering a block with 128 different cells and writing 32 kB of data, the first write results in 42.66 data writes while the second write results in 32 writes for a total of 74.66 writes. Previously, the number of writes for 32 kB would be 64 writes. Thus, by writing twice prior to erasure, more data can be stored.

27 Claims, 5 Drawing Sheets

(51) Int. Cl.
*G11C 16/04* (2006.01)
*G11C 16/08* (2006.01)

(58) Field of Classification Search
USPC .......................................................... 711/102
See application file for complete search history.

(56) References Cited

U.S. PATENT DOCUMENTS

| | | | |
|---|---|---|---|
| 8,879,319 B1 | 11/2014 | Cassuto et al. | |
| 9,070,427 B2 | 6/2015 | Sharon et al. | |
| 2007/0101096 A1* | 5/2007 | Gorobets | G06F 12/0246 711/103 |
| 2012/0218827 A1* | 8/2012 | Baek | G11C 16/14 365/185.22 |
| 2013/0301352 A1* | 11/2013 | Shim | G11C 16/10 365/185.03 |
| 2013/0304966 A1* | 11/2013 | Joo | G06F 12/0246 711/103 |
| 2013/0311715 A1* | 11/2013 | Abraham | G11C 11/5628 711/103 |
| 2014/0122773 A1* | 5/2014 | Abraham | G11C 16/0483 711/103 |
| 2015/0193156 A1* | 7/2015 | Patel | G06F 11/1471 711/103 |
| 2015/0248325 A1 | 9/2015 | Calderbank et al. | |
| 2015/0363105 A1* | 12/2015 | Nakao | G06F 12/0802 711/103 |
| 2015/0378613 A1* | 12/2015 | Koseki | G06F 3/0608 711/103 |
| 2016/0155495 A1 | 6/2016 | Oh | |
| 2016/0364141 A1* | 12/2016 | Yeh | G06F 3/061 |

OTHER PUBLICATIONS

Brian M. Kurkoski; IEEE Globecom 2010 Workshop on Application of Communication Theory to Emerging Memory Technologies; Rewriting Codes for Flash Memories Based Upon Lattices, and an Example Using the E8 Lattice; dated 2010; 5 total pages.

Wang, et al.; 3D-FlashMap: A physical-location-aware block mapping strategy for 3D NAND flash memory; 2012 Design, Automation & Test in Europe Conference & Exhibition; Dresden; dated 2012; 1 page.

Jaeyong, et al.; USENIX; The Advanced Computing Systems Association; Lifetime Improvement of NAND Flash-based Storage Systems Using Dynamic Program and Erase Scaling; dated Feb. 17-20, 2014; 15 total pages.

Office Action for Korean Application No. 10-2017-0117260 dated Nov. 22, 2018.

* cited by examiner

DATA MAPPING ENABLING FAST READ MULTI-LEVEL 3D NAND TO IMPROVE LIFETIME CAPACITY

CROSS-REFERENCE TO RELATED APPLICATIONS

This application claims benefit of U.S. Provisional Patent Application Ser. No. 62/438,821, filed Dec. 23, 2016, which is herein incorporated by reference.

BACKGROUND OF THE DISCLOSURE

Field of the Disclosure

Embodiments of the present disclosure generally relate to a method for writing data to a NAND block multiple times prior to erasing the block.

Description of the Related Art

Flash memory based solid-state drives (SSD) have advantages over traditional hard disk drives (HDDs) in that SDDs have a high throughput, low read/write latency, low power consumption and the ability to tolerate high pressure and temperature. NAND flash in particular has a low price and a large capacity compared to other non-volatile memories (NVMs). Flash memories using floating gates (or charge trap) transistors to trap charge and the data represented by the amount of charge, called cell levels, trapped in a group of cells. One of the key features of NAND flash is the asymmetry of programming and erasing. The unit of programming (increasing cell levels) is called a page and consists of $10^3$ to $10^4$ cells, while the unit of erasing (decreasing cell levels) is a block containing hundreds of pages. A block erasure is time and energy consuming, and degrades the physical cells.

NAND flash has a disadvantage, however, NAND flash can only be written once. The data can be read multiple times, but if the data location is to be used again to store new data, the old data must be erased. As noted above, erasure occurs by blocks and thus, many pages of data are erased at a time. Furthermore, NAND erasure decreases the lifetime of the NAND device.

There is a need in the art to increase the lifetime of NAND devices.

SUMMARY OF THE DISCLOSURE

In this disclosure, data mapping based on three dimensional lattices that have an improved sum rate (i.e., lifetime capacity) with low read latency is disclosed. During the write, a memory location is written to multiple times prior to erasure. Specifically, for the first write, there are 4/3 bits per cell available for writing, which is about 10.67 kB per cell are used for data storage. Then, for the second write, there is one bit per cell, which is 8 kB per cell for data storage. If considering a block with 128 different cells and writing 32 kB of data, the first write results in 42.66 data writes while the second write results in 32 writes for a total of 74.66 writes. Previously, the number of writes for 32 kB would be 64 writes. Thus, by writing twice prior to erasure, more data can be stored.

In one embodiment, a system comprises a host device; a memory system coupled to the host device. The memory system includes: means to write data to a memory location multiple times prior to erasure; means to read data from the memory location; and means to erase data from the memory location. The system additionally comprises controller coupled to the host device and the memory system.

In another embodiment, a method comprises writing a first set of data to a NAND flash block in a first memory location; writing a second set of data to the first memory location; and erasing the first memory location, wherein writing the second set of data occurs prior to erasing the first set of data. Additionally, a system is disclosed that comprises a processor and a memory system storing instructions that, when executed by the processor, cause the system to perform the method. Additionally, a non-transitory computer readable storage medium is disclosed that contains instructions that, when executed by a processor, causes a computer system to burn files after a read process has been completed, by performing the method.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
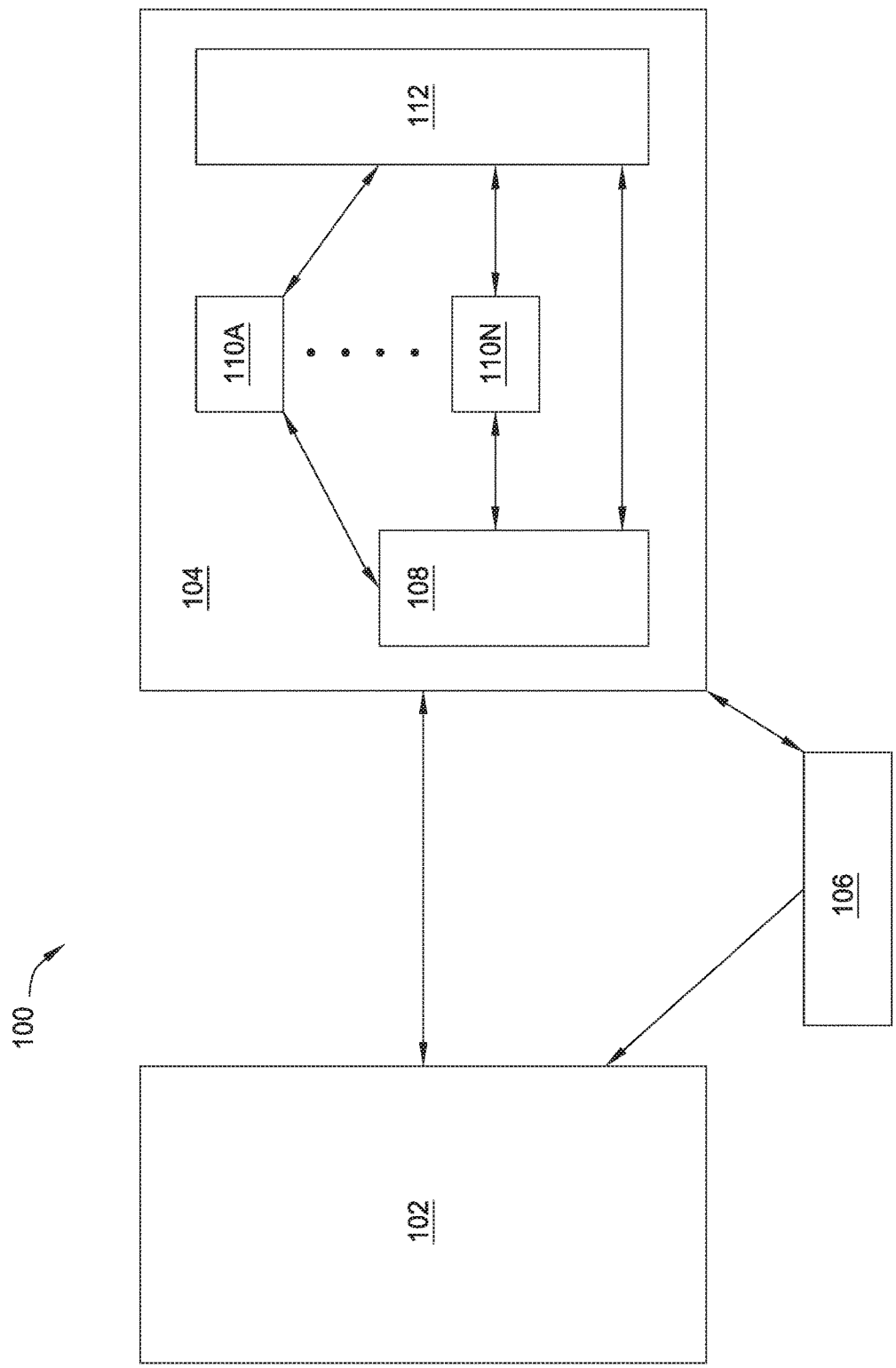
FIG. 1 is a schematic illustration of a system according to an embodiment of the disclosure.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

In this disclosure, data mapping based on three dimensional lattices that have an improved sum rate (i.e., lifetime capacity) with low read latency is disclosed. During the write, a memory location is written to multiple times prior to erasure. Specifically, for the first write, there are 4/3 bits per cell available for writing, which is about 10.67 kB per cell are used for data storage. Then, for the second write, there is one bit per cell, which is 8 kB per cell for data storage. If considering a block with 128 different cells and writing 32 kB of data, the first write results in 42.66 data writes while the second write results in 32 writes for a total of 74.66 writes. Previously, the number of writes for 32 kB would be 64 writes. Thus, by writing twice prior to erasure, more data can be stored.

In this disclosure, data mapping based on three dimensional lattices that have an improved sum rate (i.e., lifetime capacity) with low read latency is disclosed. During the write, an assumption is used that all logical pages are available at the encoder. During the read, the mapping has advantages that for each logical page, only a subset of read thresholds are needed to decode the data in the corresponding page, and thus the read latency is largely reduced. To be more specific, low read latency data mappings are used for a four level MLC and eight level TLC flash memories. For MLCs, the mapping achieves 17% improvement in total data stored. The code is defined by encoding and decoding maps. For TLC, in order to comply with Gray codes used in current NAND technology, similar, yet separate from MLC design, designs of mapping can achieve 11% to 24% improvement lifetime capacity.

Rewriting codes can improve the lifetime capacity of NAND flash. All existing rewriting codes for NAND flash assume that the exact cell levels are known to decoders and thus, the number of reads needed is q−1. Current NAND technology enables low latency page reads by dividing a physical page into log q logical pages so that the average number of reads per page is (q−1)/log q. As discussed herein two write rewriting codes can be used to enable low latency page reads for multi-level NAND flash memories. The codes enable 17% capacity improvement for the NAND flash memory while maintaining 1.5 reads per page for a four level multiple level cells (MLCs). For eight level triple level cells (TLCs) with the Gray code used in current NAND technology, the codes enable 11% and 24% capacity improvement with 2 and 2.5 reads per page respectively.

Rewriting codes are a generalization of write-once memory (WOM) codes and are an effective means to write more data into the NAND flash between erasures. 3D NAND flash reduces the coupling effect induced inter-cell interference (ICI) such that rewriting codes can be practical. However, all existing rewriting codes necessitate reading exact cell levels to be decoded, which forfeits the low read latency advantages. For example, for four level NAND flash, two binary logical pages (lower and upper pages) are mapped to one quaternary physical page of the same size. Suppose the four symbols are represented by a Gray code (11), (10), (00), (01), from low to high, where the purpose of using Gray codes is to reduce the bit error rate for logical pages. Then reading the lower page is performed by applying one read threshold between level (10) and (00) to identify the left bit (called LSB). Similarly, reading the upper page is performed by applying two read thresholds, one between (11) and (10) and the other between (00) and (01), to identify the right bit (called MSB). Compared to reading the exact cell level using three read thresholds to distinguish all four symbols, the number of reads per page is 1.5 (reduced from 3) on average.

Thus, the parameters that are of primary interest are sum-rate $R_{sum}$ bits/cell and average number of reads per page $t_{ave}$. For example, a non-rewriting scheme enabling low latency read for cells can be represented as $(R_{sum}, t_{ave})=(\log q, ((q-1)/(\log q))$ and a capacity achieving rewriting code requiring to read exact cell levels for a q-level NAND flash is $$(R_{sum}, t_{ave}) = \left(\log\binom{q+1}{q-1}, q-1\right).$$

In particular, $(R_{sum}, t_{ave})=(3.32, 3)$ and $(R_{sum}, t_{ave})=(5.17, 7)$ for capacity achieving two write WOM codes for four level MLCs and eight level TLCs flash respectively. Since read latency helps determine SSD performance, codes can be constructed with $$t_{ave} \approx \frac{q-1}{\log q}$$

to maintain low read latency and improve $R_{sum}$.

The rewriting codes disclosed herein improve the sum-rate (i.e., lifetime capacity) with low read latency. The coding schemes use the current Gray mapping between logical data and physical cell levels, which avoids hardware and circuit redesign inside the chip. During the writing, an assumption in the current NAND programming technology is made. The assumption is that all logical pages are available at the encoder. During the read, the rewriting codes have advantages that for each logical page, only a subset of q−1 read thresholds are needed to decode the data in the corresponding page, and thus the read latency is largely reduced. To be more specific, low read latency rewriting codes for four level MLC and eight level TLC flash memories are disclosed herein. For MLCs, the proposed codes archives $(R_{sum}, t_{ave})=(2.33, 1.5)$ with 17% improvement in sum-rate over current $(2, 1.5)$ non-rewriting schemes. The code is defined by encoding and decoding maps for each write and each logical page and it can also be visualized by a labeling of a three dimensional cube. For TLC, similar yet separate from MLC designs of rewriting codes can achieve $(R_{sum}, t_{ave})=(3.33, 2)$ with improvement of both sum-rate and read latency over current $(3, 2.33)$ non-rewriting schemes.

Suppose the number of cells is n and let $c_1, \ldots, c_n$ be the cell levels of those n cells. Assuming each cell has q levels, $(0, 1, \ldots, q-1)$, the integer set $(0, 1, \ldots, n-1)$ will be denoted by [n]. Let $x_i$ denote the ith element in array $x=(x_1, \ldots, x_n)$, $x_i^j=(x_i, x_{i+1}, \ldots, x_j)$ denote the subvector of x, for $1 \leq i \leq j \leq n$. For two vectors $x_1^n$ and $y_1^n$, $x_1^n \succcurlyeq y_1^n$ if $\forall i \in \{1, \ldots, n\}$, $x_i \geq y_i$. For a mapping f: A→B, the image of f is denoted by Im(f) and denoted the image of $\tilde{A} \subset A$ under f by $f(\tilde{A}) \subset B$. The discussion below will focus on two writes where on the second write, cell levels can only increase in the ordered set $(0, 1, \ldots, q-1)$.

A read corresponds to applying a read threshold to all n cells and a length-n Boolean vector that describes whether the ith cell is above or below the read threshold is returned, for $i \in \{1, \ldots, n\}$. Thus, if t reads $(r_1, \ldots, r_t)$ are performed to one page, the ordered set $(0, 1, \ldots, q-1)$ is partitioned into t+1 intervals. Note that if t=q−1, then the exact symbol in $(0, 1, \ldots, q-1)$ is read at the cost of read latency.

Two-Write Low Read Latency Rewriting Codes for MLC Flash Memories

In this section, the low latency rewriting codes are modeled mathematically. Additionally, a code construction that enables low latency reads for four level MLC flash memories is provided. The Gray mapping $\mathcal{G}_2$ is shown in Table I, which is consistent with the current NAND technology and thus does not require hardware/circuit redesign in NAND chips.

Definition on Low Latency Rewriting Codes for Four Level MLC NAND Flash

Let the bijection between cell levels to (LSB, MSB) pairs be denoted by the Gray code $\mathcal{G}_2$. Let $\psi_n: \{0, 1, 2, 3\}^n \mapsto \{0, 1\}^n$ denote the LSB read of a page by applying one threshold between cell levels (1, 2). Let $\phi_n: \{0, 1, 2, 3\}^n \mapsto \{0, 1\}^n$ denote the MSB read of a page by applying two thresholds between cell levels (0, 1) and (2, 3). The mappings $\mathcal{G}_2$, $\psi_1$ and $\phi_1$ used in current NAND technology are defined in Table I. The following is denoted: $\psi_n(c_1^n)=(\psi_1(c_1)\ldots\psi_1(c_n))$, $\phi_n(c_1^n)=(\phi_1(c_1)\ldots\phi_1(c_n))$, $\forall c_1^n \in \{0, 1, 2, 3\}^n$.

TABLE I

GRAY CODES OF LENGTH 2 USED FOR MLC NAND

| | i | | | |
|---|---|---|---|---|
| | 0 | 1 | 2 | 3 |
| $G_2$ (i) | 11 | 10 | 00 | 01 |
| LSB read $\psi_1$ (i) or $\psi$ (i) | 1 | 1 | 0 | 0 |
| MSB read $\phi_1$ (i) or $\phi$ (i) | 1 | 0 | 0 | 1 |

The subscripts of $\psi_n$ and $\phi_n$ will be omitted if arguments of $\psi(\cdot)$ and $\phi(\cdot)$ have explicit length from context.

An $[n;(2^{nR_{1\psi}},2^{nR_{1\phi}});(2^{nR_{2\psi}},2^{nR_{2\phi}})]$ two write low read latency rewriting code C is defined by two sets of joint encoders and page decoders $\{\varepsilon_1, D_{1\psi}, D_{1\phi}\}$ and $\{\varepsilon_2, D_{2\psi}, D_{2\phi}\}$. The encoders are mappings:

$\varepsilon_1: [2^{nR_{1\psi}}] \times [2^{nR_{1\phi}}] \mapsto Im(\varepsilon_1) \subset [q]^n$, $\varepsilon_2: [2^{nR_{2\psi}}] \times [2^{nR_{2\phi}}] \mapsto Im(\varepsilon_1) \rightarrow Im(\varepsilon_2) \subset [q]^n$, such that $\forall (m_\psi, m_\phi, c_1^n) \in [2^{nR_{2\psi}}] \times [2^{nR_{2\phi}}] \times Im(\varepsilon 1), \varepsilon_2 (m\psi, m\phi, c_1^n) \succcurlyeq c_1^n$.

The page decoders are mappings:

$D_{i\psi}: \psi(Im(\varepsilon_i)) \mapsto [2^{nR_{i\psi}}]$ (for LSB), $D_{i\phi}: \phi(Im(\varepsilon_i)) \mapsto [2^{nR_{i\phi}}]$ (for MSB), such that:

$\forall i \in \{1,2\}, m_{i\psi} \in [2^{nR_{i\psi}}], m_{i\phi} \in [2^{nR_{i\phi}}]$ $D_{1\psi}(\psi(\varepsilon_1(m_{1\psi}, m_{1\phi}))) = m_{1\psi}$, $D_{1\phi}(\phi(\varepsilon_1(m_{1\psi}, m_{1\phi}))) = m_{1\phi}$, $D_{2\psi}(\psi(\varepsilon_2(m_{2\psi}, m_{2\phi}, \varepsilon_1(m_{1\psi}, m_{1\phi})))) = m_{2\psi}$, $D_{2\phi}(\phi(\varepsilon_2(m_{2\psi}, m_{2\phi}, \varepsilon_1(m_{1\psi}, m_{1\phi})))) = m_{2\phi}$.

The rate of logical page corresponding to LSBs on each write is $R_{1\psi}$ and $R_{2\psi}$, and the rate of logical page corresponding to MSBs on each write is $R_{1\phi}$ and $R_{2\phi}$. The sum rate is $\sum_{i=1}^{2} R_{i\psi} + \sum_{i=1}^{2} R_{i\phi}$.

In the definition discussed above, there are two logical pages storing data corresponding to LSBs and MSBs of a physical page. Note that the difference between the definition for low read latency rewriting cores and the definition of regular multi-level WOM codes lies in that the page decoders $D_{1\psi}$, $D_{2\psi}$ (or $D_{1\phi}$, $D_{2\phi}$) only have information of LSBs read by $\psi$ (or MSBs read by $\phi$) from a physical page, and nevertheless need to decode correctly their own logical page regardless of the data in the other logical page. The number of read thresholds to decode LSB-represented and MSB-represented logical pages is 1 and 2 respectively, which is equivalent to conventional non-rewriting schemes that require 1.5 reads per logical page.

Consider n=3 cells ($c_1$, $c_2$, $c_3$) where $c_i \in \{0, 1, 2, 3\}$ is the level of the ith cell. If a physical page contains a multiple of three cells, then the cells are concatenated and each set of consecutive three cells store data according to the proposed rewriting codes.

Let q=4 (MLC) be the number of levels in a physical cell. Let the bijection (Gray code) between cell levels to (LSB, MSB) pairs, the LSB reads function $\psi$, and the MSB read function $\phi$: be defined in the definition above.

Let n=3. An $[n;(2^{2/3n},2^{2/3n});(2^{2/3n},2^{1/3n})]=[3;(4,4);(4,2)]$ two write low read latency rewriting code for MLC is constructed by defining the set of encoders and decoders as follows. On the first write, let $S[0]=\{111\}$, $S[1]=\{011\}$, $S[2]=\{101\}$, $S[3]=\{110\}$ be four sets each containing one element. Let Let $S^{-1}(x)$, $x \in \{0,1\}^3$ denote the set index $\{0, 1, 2, 3\}$ that contains x. Let $(m_{1\psi}, m_{1\phi}) \in [4] \times [4]$ be the data for each page on the first write, then $c_1^3 = \varepsilon_1(m_{1\psi}, m_{1m})$ encodes by choosing $\alpha \in S[m_{1\psi}], \beta \in S[m_{1\phi}]$ such that:

$$c_i = \mathcal{G}_2^{-1}(\alpha_i \beta_i), i=1,2,3 \quad (1)$$

The decoders $D_{1\psi}$, $D_{1\phi}$ for each page on the first write are:

$$\hat{m}_{1\psi} = D_{1\psi}(c_1^3) = S^{-1}(\psi(c_1^3)) \quad (2)$$

$$\hat{m}_{1\phi} = D_{1\phi}(c_1^3) = S^{-1}(\phi(c_1^3)) \quad (3)$$

On the second write, let $S_\psi[0]=\{100, 011\}$, $S_\psi[1]=\{000\}$, $S_\psi[2]=\{110, 001\}$, $S_\psi[3]=\{101, 010\}$, and $S_\phi[0]=\{011, 101, 110\}$, $S_\phi[1]=\{001, 100, 010\}$. Let $S_\psi^{-1}(x)$, $S_\phi^{-1}(x)$ be the set index that contains x and $S_\psi$ and $S_\phi$, respectively. Let $c_1^3$ be the cell levels after first write, $(m_{2\psi}, m_{2\phi}) \in [4] \times [2]$ be the data for each page on the second write, then $\varepsilon_2(m_{2\psi}, m_{2\phi})$ encodes by choosing $\alpha \in S[m_{2\psi}], \beta \in S[m_{2\phi}]$ such that:

$$c_i = \mathcal{G}_2^{-1}(\alpha_i \beta_i) \geq \tilde{c}_i, i=1,2,3 \quad (4)$$

The decoders for each page on the second write are:

$$\hat{m}_{2\psi} = D_{2\psi}(c_1^3) = S_\psi^{-1}(\psi(c_1^3)) \quad (5)$$

$$\hat{m}_{2\phi} = D_{2\phi}(c_1^3) = S_\phi^{-1}(\phi(c_1^3)) \quad (6)$$

On the second write, it is possible to find more than one pair of $(\alpha, \beta)$ such that $\mathcal{G}_2^{-1}(\alpha_i \beta_i) \geq \tilde{c}_i, \forall i=1, 2, 3$ is satisfied. The encoder is allowed to pick any pair.

For all $m_{2\psi} \in [4]$, $m_{2\phi} \in [2]$, $\tilde{c}_1^3 \in Im(\varepsilon_1)$ there exists at least one pair $(\alpha, \beta)$, where $\alpha \in S|m_{2\psi}|$, $\beta \in S|m_{2\phi}|$, such that $\mathcal{G}_2^{-1}(\alpha_i \beta_i) \geq \tilde{c}_i, i=1, 2, 3$.

The above discuss provides two write low latency (1.5 reads per logical page) rewriting codes for MLC with sum rate 7/3 bits/cell.

Example 1

Let n=3 and all cell levels are $0(c_1^3=000)$ before first write. Supposed the data for both pages needed to store on both writes are $((m_{1\psi}, m_{1\phi})=(3,2) \in [4] \times [4]$ and $(m_{2\psi}, m_{2\phi})=(1,1) \in [4] \times [2]$. On the first write, choose $\alpha=110 \in S[m_{1\psi}]=S[3]$ and $\beta=101 \in S[m_{1\phi}]=S[2]$, then according to equation (1), $$c_1^3 = (\mathcal{G}_2^{-1}(\alpha_1\beta_1)\mathcal{G}_2^{-1}(\alpha_2\beta_2)\mathcal{G}_2^{-1}(\alpha_3\beta_3)) .$$
$$= (\mathcal{G}_2^{-1}(11)\mathcal{G}_2^{-1}(10)\mathcal{G}_2^{-1}(01)) = (013)$$

To decode the data in LSB for the first write, apply one threshold for LSB read and have $\psi(013)=110$, the data is then decoded according to equation (2), $\hat{m}_{1\psi}=S^{-1}(110)=3$.

To decode the data in MSB for the first write, two thresholds are applied for MSB read and have $\phi(013)=101$, the data is then decoded according to equation (3), $\hat{m}_{1\phi}=S^{-1}(101)=2$.

On the second write, choose $\alpha=000=S_\psi[m_{2\psi}]=S[1]$, $\beta=001\in S_\phi[m_{2\phi}]=S[1]$, then according to equation (4), $c_1^3=(\mathcal{G}_2^{-1}(\alpha_1\beta_1)\mathcal{G}_2^{-1}(\alpha_2\beta_2)\mathcal{G}_2^{-1}(\alpha_3\beta_3))=(223) \succcurlyeq (013)$.

To decode the data in LSB for the second write, one threshold for LSB read is applied and have $\psi(223)=000$, the data is then decoded according to equation (5), $\hat{m}_{2\psi}=S_\psi^{-1}(000)=1$.

To decode the data in MSB for the second write, two thresholds for MSB read are applied and have $\phi(223)=001$, the data is then decoded according to equation (6), $\hat{m}_{2\phi}=S_\phi^{-1}(001)=1$.

The above construction achieves $(R_{sum}, t_{ave})=(7/3, 1.5)$. Compared to non-rewriting codes (2, 1.5) for MLC, the improvement is 17%. Note also that the sum capacity of two write four level WOM is $\log_2 10 \approx 3.32$ bits per cell. The gap between the above construction and the sum capacity of regular WOM is due to low read latency requirements. A simple analysis would show that the above construction provides the optimal two write low read latency codes based on encoding/decoding of three cells. Code constructions based on larger numbers of cells (n>3) might achieve better sum rate at the cost of design complexity (computer search) and encoding/decoding complexity.

Two Write Low Read Latency Rewriting Code for TLC Flash Memories

Code constructions for TLC flash will now be discussed. The Gray code $\mathcal{G}_3$ used in current TLC NAND technology that maps the LSB, central significant bit (CSB), and MSB to cell level $\{0, 1, \ldots, 7\}$ denoted by a triplet of functions applied during read $(\psi_l, \psi_c, \psi_m)$ is in Table III. Note that to read LSB, CSB and MSB pages, $(\psi_l(i), \psi_c(i), \psi_m(i))$ requires (2, 3, 2) read thresholds, respectively, applied at the transitions between 0 and 1 for each page.

TABLE II

GRAY CODES OF LENGTH 3 USED FOR TLC NAND

| | i | | | | | | | |
|---|---|---|---|---|---|---|---|---|
| | 0 | 1 | 2 | 3 | 4 | 5 | 6 | 7 |
| $G_3(i)$ | 111 | 110 | 100 | 000 | 010 | 011 | 001 | 101 |
| $\psi_l(i)$ | 1 | 1 | 1 | 0 | 0 | 0 | 0 | 1 |
| $\psi_c(i)$ | 1 | 1 | 0 | 0 | 1 | 1 | 0 | 0 |
| $\psi_m(i)$ | 1 | 0 | 0 | 0 | 0 | 1 | 1 | 1 |

An $[n=3; (2^2, 2^2, 2^2); (2^2, 2^2)]$ low latency rewriting code of length $n=3$, where three logical pages of size 2 bits each are stored in (LSB, CSB, MSB) on the first write and 2 logical pages of size 2 bits each are stored in (LSB, MSB) on the second write, is constructed by a set of encoders and decoders. On the first write, let $S[0]=\{000\}$, $S[1]=\{001\}$, $S[2]=\{010\}$, $S[3]=\{100\}$, let $S^{-1}(x)$ denote the set index that contains $x \in \{0, 1\}^3$. Let $(m_{1l}, m_{1c}, m_{1m}) \in [4] \times [4] \times [4]$ be the data for each page, then $c_1^3 = \varepsilon_1(m_{1l}, m_{1c}, m_{1m}):[4]\times[4]\times[4] \to \text{Im}(\varepsilon_1) \subset [8]^3$ encodes by choosing $\alpha \in S[m_{1l}]$, $\beta \in S[m_{1c}]$, $\gamma \in S[m_{1m}]$ such that:

$$c_i = \mathcal{G}_3^{-1}(\alpha_i\beta_i\gamma_i), i=1,2,3 \quad (7)$$

The decoders for each page on the first write is defined by:

$$\hat{m}_{1i} = D_{1i}(c_1^3) = S^{-1}(\psi_i(c_1^3)), i=l,c,m \quad (8)$$

On the second write, $\mathcal{G}_2$ is used instead of $\mathcal{G}_3$. Let $S_{\psi l}[0]=\{101, 010\}$, $S_{\psi l}[1]=\{100, 011\}$, $S_{\psi l}[2]=\{000\}$, $S_{\psi l}[3]=\{110, 001\}$ and $S_{\psi m}[0]=\{111\}$, $S_{\psi m}[1]=\{001, 110\}$, $S_{\psi m}[2]=\{011, 100\}$, $S_{\psi m}[3]=\{101, 010\}$. Let $S_{\psi l}^{-1}(x)$, $S_{\psi m}^{-1}(x)$ be the set index in $\{0, 1, 2, 3\}$ that contains x. Let $\tilde{c}_1^3$ be the cell levels after first write, $(m_{2\psi l}, m_{2\psi m}) \in [4]\times[4]$ be the data for both pages on the second write, then $\varepsilon_2(m_{2\psi l}, m_{2\psi m})$ encodes by choosing $\alpha \in S[m_{2\psi l}]$, $\beta \in m_{2\psi m}$ such that:

$$c_i = \mathcal{G}_2^{-1}(\alpha_i\beta_i)+4 \geqslant \tilde{c}_i, \forall i=1,2,3 \quad (9)$$

The decoders $D_{2l}$, $D_{2m}$ for each page on the second write are:

$$\hat{m}_{2i} = D_{2i}(c_1^3) = S_{\psi_i}^{-1}(\psi_i(c_1^3)), i=l \text{ and } m \quad (10)$$

In the above construction, for all $(m_{2\psi l}, m_{2\psi m}) \in [4]\times[4]$ and $\tilde{c}_1^3 \in \text{Im}(\varepsilon_1)$, there exists at least one pair $(\alpha, \beta)$, where $\alpha \in S[m_{2\psi l}]$, $\beta \in m_{2\psi m}$ such that $\mathcal{G}_2^{-1}(\alpha_i\beta_i)+4 \geq \tilde{c}_i, \forall i=1, 2, 3$.

Moreover, the number of reads for $D_{1\psi_l}$, $D_{1\psi_c}$, $D_{1\psi_m}$ is (2, 3, 2) for the first write, the number of reads for $D_{2\psi_l}$, $D_{2\psi_m}$ is (1, 2) on the second write, then $$t_{ave} = \frac{2+3+2+1+2}{5} = 2$$

reads per page. The sum rate is 10/3 bits per cell. Therefore, the above construction is an $(R_{sum}, t_{ave})=(10/3, 2)$ code, which improves both sum rate and read latency comparing to non-rewriting (3, 7/3) scheme.

Figure 4:
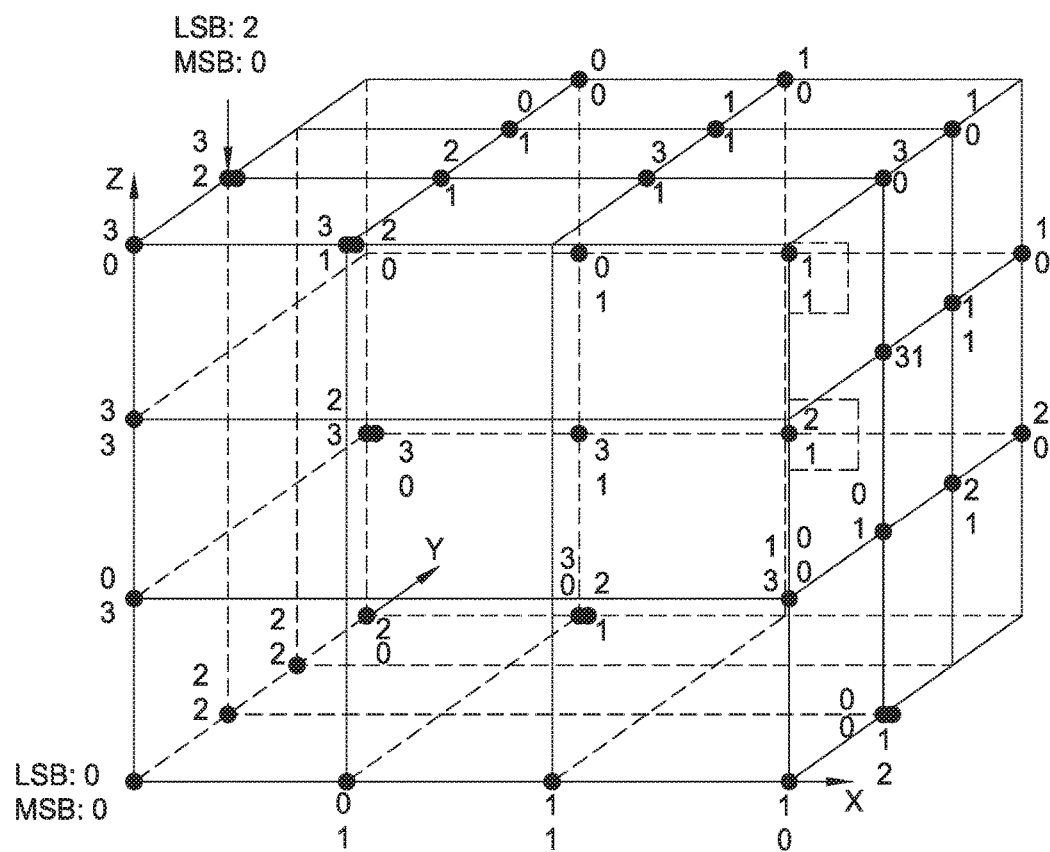
FIG. 4 is an encoding and decoding mapping of a 2-write low read latency code 3D representative model.

A close look at the code design process (determining the contents of S, $S_{\psi}$, $S_{\phi}$ for MLC and S, $S_{\psi l}$, $S_{\psi m}$ for TLC) would reveal that the encoders/decoder is a labeling problem on the n-dimensional cube. The labeling for n=3 in the above constructions are manually designed on three dimensional cubes. For example, FIG. 4 shows an equivalent encoding/decoding visualized in a cubical grid of lateral size 4. $\text{Im}(\varepsilon_1)$ is the set of black points and $\text{Im}(\varepsilon_2)$ is the set of red points. Labels on points are the data pairs for both logical pages. Shaded labeling (or dashed lines) mean the particular point (or grid) is on the invisible side of the cube. The triplet, e.g., $c_1^3=(013)$, indicates that xyz coordinates of a few example points. Note that some points are in both $\text{Im}(\varepsilon_1)$ and $\text{Im}(\varepsilon_2)$, e.g., overlapping black and red points at $c_1^3=(013)$ with data message pair 3, 2 and 2, 0 for each write. Example 1 above shows two pairs of data messages on both writes as $(m_{1\psi}, m_{1\phi})=(3,2)$, $(m_{2\psi}, m_{2\phi})=(1,1)$, which corresponds to the sequence of cell level changes (staring from the origin) $(000)\to(013)\to(223)$ as shown in FIG. 4.

For TLC, with n>3, the first write can be designed similarly as n=3, but the second write needs a computer search for good codes. In order to achieve a better sub rate, tradeoffs are made by using three thresholds for the second write, and thus $$t_{ave} = \frac{2+3+2+3}{4} = 2.5$$

reads per page. Table III lists the sum rate and the number of reads on both writes, where column with n=1 is the conventional non-rewriting schemes.

TABLE III ($R_{SUM}$, $t_{AVE}$) FOR TLC WITH n ≥ 3

| | n | | | | |
|---|---|---|---|---|---|
| | 1 | 3 | 5 | 7 | 9 | 11 |
| $nR_1$ | 3 | 6 | 12 | 18 | 24 | 30 |
| $nR_2$ | 0 | 4 | 5 | 7 | 9 | 11 |
| $R_{sum}$ (bits/cell) | 3 | 3.33 | 3.40 | 3.57 | 3.67 | 3.73 |
| $t_{ave}$ | 2.33 | 2 | 2.5 | 2.5 | 2.5 | 2.5 |

The low ready latency rewriting codes discussed herein are based on three dimensional lattices to enable fast read as current NAND technology supports. Separate designs for MLC and TLC flash improve the sum rate, or lifetime capacity, by 17%, 11% and 24%, with 1.5, 2 and 2.5 reads per page respectively.

The present disclosure relates to data mapping based on three dimensional lattices that have an improved sum rate (i.e., lifetime capacity) with low read latency. During the write, an assumption is used that all logical pages are available at the encoder. During the read, the mapping has advantages that for each logical page, only a subset of read thresholds are needed to decode the data in the corresponding page, and thus the read latency is largely reduced. To be more specific, low read latency data mappings are used for a four level MLC and eight level TLC flash memories. For MLCs, the mapping achieves 17% improvement in total data stored. The code is defined by encoding and decoding maps. For TLC, in order to comply with Gray codes used in current NAND technology, similar, yet separate from MLC design, designs of mapping can achieve 11% to 24% improvement lifetime capacity.

The basic premise of NAND flash memory is that the memory can only be written one time and then, if the memory is to be written again, the memory will need to be erased. As discussed herein, rather than erasing the memory, it is possible to write in the memory locations again prior to erasure and thus, the lifetime of the NAND flash memory is increased, as is the storage capacity.

FIG. 1 is a schematic illustration of a system 100 according to one embodiment. The system includes a host device 102 that interacts with a memory system 104. A controller 106 is coupled to both the host device 102 and the memory system 104. The memory system 104 stores data that may be needed by the host device 102 at various times. When the data is needed, the host device 102 contacts the memory system 104 to obtain the data. The controller 106 controls the communication between the memory system 104 and the host device 102.

The memory system 104 includes a memory controller 108 and multiple CPUs or processors 110A-110N. The memory system 104 also includes a memory device 112. The memory device 112 is coupled to all of the CPUs 110A-110N as well as the memory controller 108. In one embodiment, the memory device 112 is a NAND storage device. In another embodiment, the memory device 112 is a HDD storage device. It is to be understood that the memory device 112 is not to be limited to either a NAND storage device or a HDD storage device. Rather, the memory device 112 is applicable to any storage device capable of storing data that may be retrieved by one or more CPUs.

Figure 2:
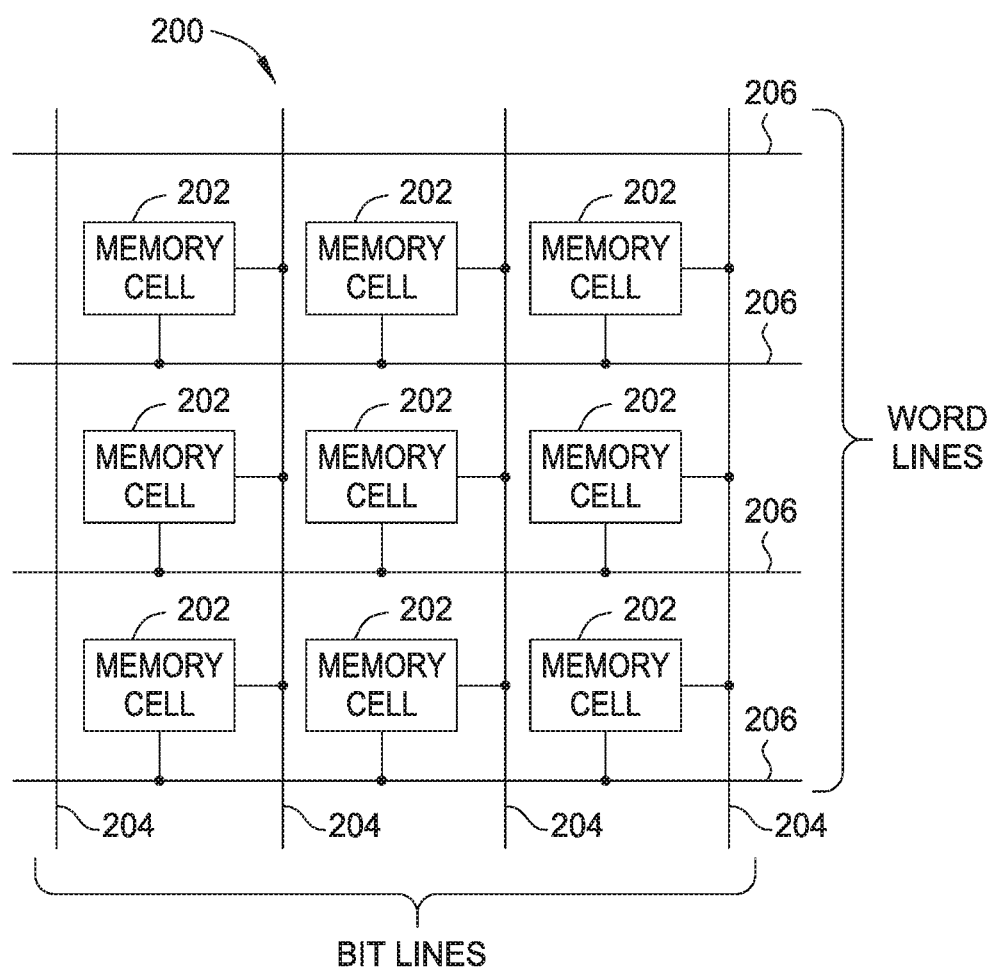
FIG. 2 is a schematic illustration of a memory array according to an embodiment of the disclosure.

FIG. 2 is a schematic diagram of a memory array 200, according to one embodiment described herein. The memory array 200 includes a plurality of memory cells 202, a first plurality of parallel lines 204, and a second plurality of parallel lines 206. The first plurality of parallel lines 204 run orthogonal to the second plurality of parallel lines 206. The first plurality of parallel lines 204 represent bit lines. The second plurality of parallel lines 206 represent word lines. Each memory cell 202 is coupled to a bit line 204 and a word line 206. Co-linear memory cells 202 are coupled to one common line and one line not in common with the other co-linear memory cells.

Figure 3C:
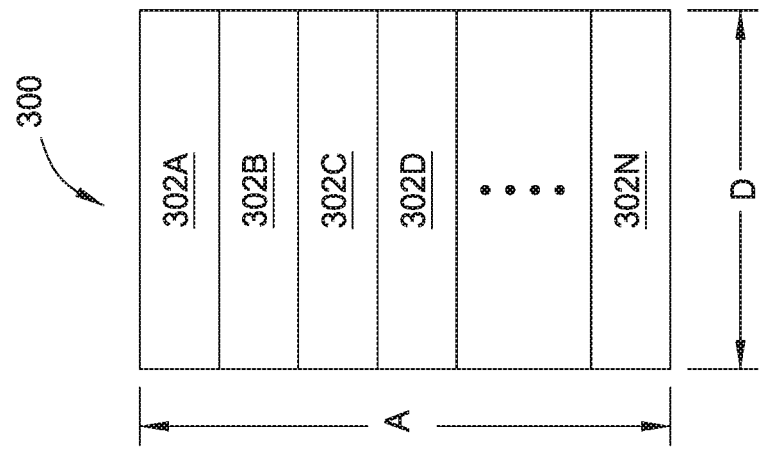
FIGS. 3A-3C are schematic illustrations of a NAND flash memory block.
Figure 3B:
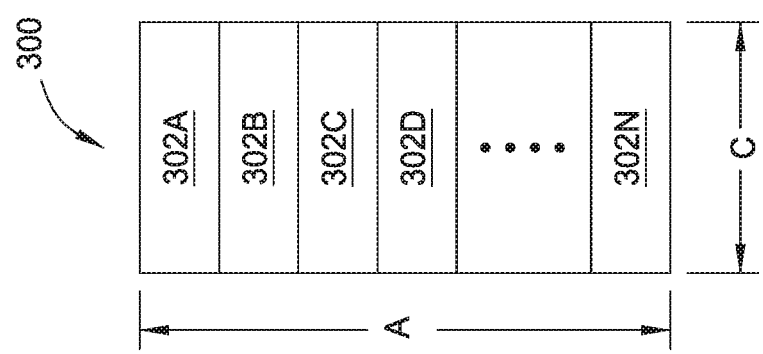
Figure 3A:
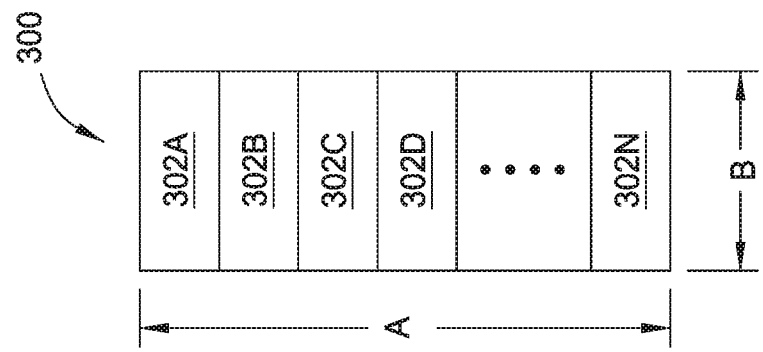

FIGS. 3A-3C are schematic illustrations of a NAND flash memory block 300. The block 300 includes 128 word lines spanning the entire block as shown by arrows "A". The amount of available data exposed to the user is represented by arrows "B" and is 16 kB. In a simple situation where all data to be stored is comprised of 32 kB of data, each set of data would need two separate word lines and thus, two separate memory locations 302A-302N to store the data in a single write-single erase system. Thus, the block 300, prior to initial usage, has the ability to store 64 sets of data in the 128 word lines. FIG. 3A shows the situation where each bit can only be written once prior to erasure because the amount of available data exposed to the user is 16 kB. Prior to the instant disclosure, there were 2 bits per cell, but each bit could only be written once prior to erasure.

As will be discussed herein, there are 4/3 bits per cell for the first writing and 1 bit per cell on the second writing (or update writing). Because there are 4/3 bits per cell for the first writing, then there is only 10.67 kB of data exposed to the user for the first write represented by arrows "C" in FIG. 3B. Thus, rather than just two word lines, three word lines will be necessary to store the data. Hence, for the first writing, there will be 42.66 sets of data that can be stored. Once the entire block 300 has been written, the block can be rewritten (or updated).

During the rewrite, only 8 kB of data is exposed to the user as shown by arrows "D" in FIG. 3C. Thus, for the rewrite, to store 32 kB of data, four word lines will be needed. Therefore, the rewrite (or second write) will accommodate 32 sets of data. Combining the write and rewrite, 74.66 data writes can occur, which is greater than the 64 that occurs if there is only one write. The 74.66 write represents an almost 17% increase in storage capacity. Because there is an increase in storage capacity, there is less erasure and thus, longer NAND flash memory device life.

Example 2

In Example 2, code mapping for 3 MLC cells with minimum changes will be discussed. L is low (0 or 1); H is high (2 or 3); I is in (level 1 or 2); and O is out (level 0 or 3). The current mapping for a 4-level MLC is {E, P1, P2, P3}={11, 10, 00, 01}. During the first write process, {0, 1, 2, 3} translates to the following: {111, 011, 101, 110}. For LSB, 0→LLL {111}; 1→HLL {011}; 2→LHL {101}; and 3→LLH {110}. For MSB, 0→OOO {111}; 1→IOO {011}; 2→OIO {101}; and 3→OOI {110}. For the first write process, (LSB, MSB), the LSB=3={110} and MSB=2={101}. The first update is programmed to (0,1,3); when the LSB is read, the pattern=(L,L,H), and all (L,L,H)-pattern corresponds to LSB=3. When reading the MSB, the pattern=(O,I,O), and all (O,I,O) patterns correspond to MSB=2. Considering the digits in order of the LSB and MSB together (LSB first followed by MSB), the resulting pairs are (11, 10, 01) which, according to the mapping noted above, equals (E, P1, P3)=$C_1^3$.

For the second writing, or updated writing, both the LSB and MSB depend upon $C_1^3$. For LSB, 00 (or 0)→LHH {100}, HLL {011}; 01 (or 1)→HHH {000}; 10 (or 2)→LLH {110}, HHL {001}; 11 (or 3)→LHL {101}, HLH {010}. For MSB, 0→IOO {011}, OIO {101}, OOI {110}; 1→IIO {001}, OII {100}, IOI {010}. For the second writing (or update), (LSB, MSB)=(3,0) and is programmed to (3,1,3). When the LSB is read, the pattern is (H,L,H), and all (H,L,H) patterns correspond to LSB=3. When reading MSB, the pattern is (O,I,O), and all (O,I,O) patterns correspond to MSB=0.

If LSB=(101) and MSB=(101) are chosen, then considering the digits in order of the LSB and MSB together (LSB first followed by MSB), the resulting pairs are (01, 10, 01) which, according to the mapping noted above, equals (P3, P1, P3)=(3,1,3)=$C_1^3$. For Example 2, there are 2 bits LSB and 2 bits MSB on the first write. Then, there are 2 bits LSB and 1 bit MSB on the second write (or update) for a total of 7 bits for 3 cells. Note that the 3 MLC cells can store 6 bits conventionally. Therefore, the 7 bits represent a 17% increase. The average reads per page is 1.5 which equals the conventional reads per page. Thus, the read latency does not suffer, yet the amount of data that can be stored has increased. FIG. 4 is an encoding and decoding mapping of a 2-write low read latency code 3D representative model of Example 2.

Figure 5:
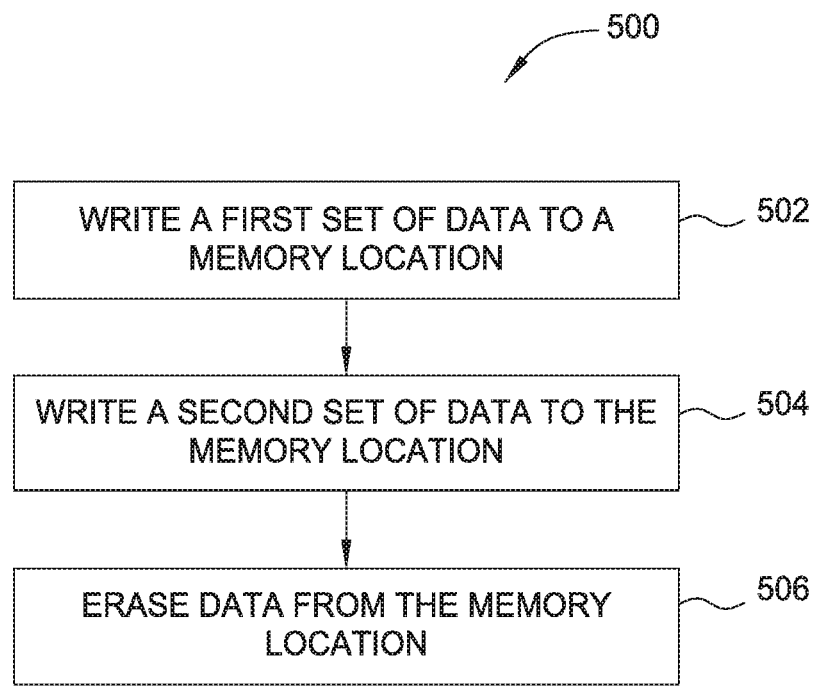
FIG. 5 is a flowchart illustrating a method of writing data twice to the same memory location prior to erasing the data.

FIG. 5 is a flowchart 500 illustrating a method of writing data twice to the same memory location prior to erasing the data. As shown in FIG. 5, a first set of data is initially written to a memory location in block 502. Then, prior to any erasure, a second set of data is written to the memory location in block 504. Finally, in block 506, the data can be erased from the memory location. Prior to the disclosure, the block 506 would occur prior to block 504 because data could only be written once to the memory location, but as discussed herein, less than the entire memory location is utilized in the first write. Thus, when the time comes for the second write, there is still room for more data to be written to the memory location. Therefore, by writing twice to the same memory location, more data can be stored prior to erasure.

Example 3

In Example 3, code mappings for 3 TLC cells with minimum changes will be discussed. The current mapping for an 8-level MLC is {E, P1, P2, P3, P4, P5, P6, P7}={111, 110, 100, 000, 010, 011, 001, 101}. During the first write process, {0, 1, 2, 3} translates to the following: {000, 001, 010, 011}. The LSB=1={001}, the CSB=2={010} and MSB=1={001}. Considering the digits in order of the LSB, CSB and MSB together (LSB first followed by CSB and then MSB), the resulting groups are (000, 010, 101) which, according to the mapping noted above, equals (P3, P4, P7)=$C_1^3$. For the second writing, or updated writing, only the LSB and MSB are used and depend upon $C_1^3$. Additionally, P4, P5, P6, P7)={11, 10, 00, 01}. For LSB, 0→101, 010; 1→100, 011; 2→000; 3→110, 001. For MSB, 0→111; 1→001, 110; 2→011, 100; 3→101, 010. For the second writing (or update), LSB=3=(110) or (001). MSB=0=(111). If LSB=(110) and MSB=(111) are chosen, then considering the digits in order of the LSB and MSB together (LSB first followed by MSB), the resulting pairs are (11, 11, 01) which, according to the mapping noted above, equals (P4, P4, P7)=(4,4,7)=$C_1^3$. For Example 3, there are 2 bits LSB, 2 bits CSB and 2 bits MSB on the first write. Then, there are 2 bits LSB and 2 bits MSB on the second write (or update) for a total of 10 bits for 3 cells. Note that the 3 TLC cells can store 9 bits conventionally. Therefore, the 10 bits represent an 11% increase. The average reads per page is 2 which is less than the 2.33 conventional reads per page. Thus, the read latency is reduced and the amount of data that can be stored has increased.

Writing data once and then erasing does not maximize resources. Doing so leads to short device life and eventual device failure. By writing twice to the same memory location prior to erasing the memory location, not only can more data be stored, but the device life is increased (relative to storing once and then erasing) because the data will not be erased until the memory location is used twice for storage.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
   writing a first set of data to a NAND flash block in a first memory location, wherein writing the first set of data utilizes less than all of the first memory location, wherein 4/3 bits per cell are available for writing the first set of data;
   writing a second set of data to the first memory location, wherein writing the second set of data utilizes the remainder of the first memory location, wherein 1 bit per cell is available for writing the second set of data; and
   erasing the first memory location, wherein writing the second set of data occurs prior to erasing the first set of data and wherein the method occurs within a solid state drive and the writing of the first set of data and the second set of data use two write rewrite codes and wherein the codes use a current Gray mapping between logical data and physical cell levels.

2. The method of claim 1, wherein the NAND flash block is TLC.

3. The method of claim 1, wherein the NAND flash block is MLC.

4. The method of claim 3, wherein the first memory location is a 16 kB storage location and wherein writing the first set of data comprises writing data to about 10 kB of the first memory location.

5. The method of claim 4, wherein writing the second set of data comprises writing data to about 8 kB of the first memory location.

6. The method of claim 5, wherein the about 10 kB is different from the about 8 kB.

7. The method of claim 5, wherein the first set of data is present in the first memory location when the second set of data is written to the first memory location.

8. The method of claim 5, wherein the first set of data is present in the first memory location after the second set of data is written to the first memory location.

9. The method of claim 1, wherein the memory location is disposed within a memory block at the intersection of a word line and a bit line.

10. A system, comprising:
    a processor; and
    a memory system storing instructions that, when executed by the processor, cause the system to:
    write a first set of data to a NAND flash block in a first memory location, wherein writing the first set of data utilizes less than all of the first memory location, wherein 4/3 bits per cell are available for writing the first set of data;

write a second set of data to the first memory location, wherein writing the second set of data utilizes the remainder of the first memory location, wherein 1 bit per cell is available for writing the second set of data; and erase the first memory location, wherein writing the second set of data occurs prior to erasing the first set of data and wherein the system is a solid state drive and the writing of the first set of data and the second set of data use two write rewrite codes and wherein the codes use a current Gray mapping between logical data and physical cell levels.

11. The system of claim 10, wherein the NAND flash block is TLC.

12. The system of claim 10, wherein the NAND flash block is MLC.

13. The system of claim 10, wherein the first memory location is a 32 kB storage location and wherein writing the first set of data comprises writing data to about 10 kB of the first memory location.

14. The system of claim 13, wherein writing the second set of data comprises writing data to about 8 kB of the first memory location.

15. The system of claim 14, wherein the about 10 kB is different from the about 8 kB.

16. The system of claim 14, wherein the first set of data is present in the first memory location when the second set of data is written to the first memory location.

17. The system of claim 14, wherein the first set of data is present in the first memory location after the second set of data is written to the first memory location.

18. The system of claim 10, wherein the memory location is disposed within a memory block at the intersection of a word line and a bit line.

19. A non-transitory computer readable storage medium, containing instructions that, when executed by a processor, cause a computer system to burn files after a read process has been completed, by performing the steps of:

write a first set of data to a NAND flash block in a first memory location, wherein writing the first set of data utilizes less than all of the first memory location, wherein 4/3 bits per cell are available for writing the first set of data;

write a second set of data to the first memory location, wherein writing the second set of data utilizes the remainder of the first memory location, wherein 1 bit per cell is available for writing the second set of data; and erase the first memory location, wherein writing the second set of data occurs prior to erasing the first set of data, wherein the first memory location is within a solid state drive and the writing of the first set of data and the second set of data use two write rewrite codes and wherein the codes use a current Gray mapping between logical data and physical cell levels.

20. The storage medium of claim 19, wherein the NAND flash block is TLC.

21. The storage medium of claim 19, wherein the NAND flash block is MLC.

22. The storage medium of claim 19, wherein the first memory location is a 32 kB storage location and wherein writing the first set of data comprises writing data to about 10 kB of the first memory location.

23. The storage medium of claim 22, wherein writing the second set of data comprises writing data to about 8 kB of the first memory location.

24. The storage medium of claim 23, wherein the about 10 kB is different from the about 8 kB.

25. The storage medium of claim 24, wherein the first set of data is present in the first memory location when the second set of data is written to the first memory location.

26. The storage medium of claim 24, wherein the first set of data is present in the first memory location after the second set of data is written to the first memory location.

27. The storage medium of claim 19, wherein the memory location is disposed within a memory block at the intersection of a word line and a bit line.

* * * * *